US010069488B2

United States Patent
Steedman et al.

(10) Patent No.: US 10,069,488 B2
(45) Date of Patent: Sep. 4, 2018

(54) RAMP GENERATION MODULE

(71) Applicant: Microchip Technology Incorporated, Chandler, AZ (US)

(72) Inventors: Sean Stacy Steedman, Phoenix, AZ (US); Yong Yuenyongsgool, Gilbert, AZ (US); Jacobus Albertus van Eeden, Chandler, AZ (US); Joseph Julicher, Maricopa, AZ (US); Marilena Dracea, Bucuresti (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 75 days.

(21) Appl. No.: 14/669,321

(22) Filed: Mar. 26, 2015

(65) Prior Publication Data

US 2015/0303902 A1  Oct. 22, 2015

Related U.S. Application Data

(60) Provisional application No. 61/980,346, filed on Apr. 16, 2014.

(51) Int. Cl.
| | | |
|---|---|---|
| H03K 4/06 | (2006.01) | |
| H03K 4/50 | (2006.01) | |
| H03K 4/502 | (2006.01) | |

(52) U.S. Cl.
CPC .............. *H03K 4/50* (2013.01); *H03K 4/502* (2013.01)

(58) Field of Classification Search
CPC ........ H03F 3/245; H03F 3/195; H03F 1/0227; H03F 1/0277
See application file for complete search history.

(56) References Cited

U.S. PATENT DOCUMENTS

| | | | | |
|---|---|---|---|---|
| 8,618,848 B1* | 12/2013 | Chee | .................. | H03K 4/063 |
| | | | | 327/131 |
| 2006/0093017 A1* | 5/2006 | Gong | ................ | H02M 3/33507 |
| | | | | 375/134 |

(Continued)

FOREIGN PATENT DOCUMENTS

| | | | | |
|---|---|---|---|---|
| CN | 102802313 A | 11/2012 | ............. | H05B 37/02 |
| JP | 2006025246 A | 1/2006 | ............... | H03F 1/00 |

OTHER PUBLICATIONS

International Search Report and Written Opinion, Application No. PCT/US2015/025964, 17 pages, dated Jul. 15, 2015.

*Primary Examiner* — Sibin Chen

(74) *Attorney, Agent, or Firm* — Slayden Grubert Beard PLLC

(57) ABSTRACT

A digitally controlled ramp generator has a constant current source, a first controllable switch coupled between the constant current source and an output node, a capacitor coupled with the output node, a second controllable switch coupled with the output node, a constant current sink coupled with the second controllable switch, and a control unit. The control unit is configured in a first operating mode to select control signals for the first and second controllable switch to generate a rising waveform by charging said capacitor through the first controllable switch and a falling waveform by discharging the capacitor through the second controllable switch wherein the control signals can be selected from the group of a time based control signal and a voltage based control signal. A variety of other control modes may be provided.

45 Claims, 13 Drawing Sheets

(56) References Cited

U.S. PATENT DOCUMENTS

| | | | |
|---|---|---|---|
| 2009/0249271 A1* | 10/2009 | Yamada | G06F 11/1641 716/113 |
| 2010/0141033 A1 | 6/2010 | Wang et al. | 307/43 |
| 2010/0295462 A1* | 11/2010 | Brueckel | H05B 41/2928 315/246 |
| 2012/0025797 A1 | 2/2012 | Futamura et al. | 323/283 |
| 2013/0062504 A1* | 3/2013 | Sukegawa | H01L 27/14618 250/208.1 |
| 2014/0084884 A1 | 3/2014 | Lee | 323/271 |
| 2014/0111168 A1* | 4/2014 | Chen | H02M 3/1588 323/235 |
| 2014/0265908 A1* | 9/2014 | Su | H05B 33/0815 315/224 |

* cited by examiner

RAMP GENERATION MODULE

CROSS-REFERENCE TO RELATED APPLICATIONS

This application claims the benefit of U.S. Provisional Application No. 61/980,346 filed on Apr. 16, 2014, which is incorporated herein in its entirety.

TECHNICAL FIELD

The present disclosure relates to generating a ramp signal, in particular to a module configured to generated a ramp signal.

BACKGROUND

Many applications require a saw-tooth or triangular shaped waveforms whose parameters can be changed under program control, for example switched mode power supplies. To provide such waveforms in an application using a microcontroller, additional circuitry is necessary to be able to generate such waveforms. This is highly undesirable as it increases the costs and size of the respective application.

SUMMARY

There exists a need for providing a method to generate output waveforms based on voltage levels and/or elapsed time.

According to an embodiment, a digitally controlled ramp generator may comprise: a constant current source; a first controllable switch coupled between the constant current source and an output node; a capacitor coupled with the output node; a second controllable switch coupled with the output node; a constant current sink coupled with the second controllable switch; and a control unit configured in a first operating mode to select control signals for the first and second controllable switch to generate a rising waveform by charging said capacitor through the first controllable switch and a falling waveform by discharging the capacitor through the second controllable switch wherein the control signals can be selected from the group of a time based control signal and a voltage based control signal.

According to a further embodiment, the digitally controlled ramp generator may further comprise a first and second multiplexer for selecting respective input control signals. According to a further embodiment, the control unit may comprises a state machine receiving said input control signals and providing said control signals to said first and second switches depending on an operating mode programmed into said control unit. According to a further embodiment, the digitally controlled ramp generator may further comprise at least one one-shot unit for providing a control signal having a predetermined pulse width. According to a further embodiment, the digitally controlled ramp generator may further comprise a first comparator coupled with said output node and a first controllable threshold reference voltage. According to a further embodiment, the digitally controlled ramp generator may further comprise a second comparator coupled with said output node and a second controllable threshold reference voltage. According to a further embodiment, the controllable first and second threshold reference voltage may be generated by a first and second digital-to-analog converter, respectively. According to a further embodiment, the first threshold reference voltage may determine a minimum voltage of a waveform. According to a further embodiment, the first threshold reference voltage may determine a maximum voltage of a waveform. According to a further embodiment, the constant current source may be a digitally controllable constant current source and/or wherein the constant current sink is a digitally controllable constant current sink.

According to a further embodiment, the digitally controlled ramp generator may further comprise a reference voltage coupled with said output node via the capacitor; and a third controllable switch connected in parallel with said capacitor; wherein in a second operating mode, the control unit is configured to select control signals for the third and second controllable switch to generate a rising waveform by charging said capacitor through the third controllable switch and a falling waveform by discharging the capacitor through the second controllable switch wherein the control signals can be selected to be one of time or voltage based control signals. According to a further embodiment, the digitally controlled ramp generator may further comprise a first and second multiplexer for selecting respective input control signals. According to a further embodiment, the control unit may comprise a state machine receiving said input control signals and providing said control signals to said first and second switches depending on an operating mode programmed into said control unit. According to a further embodiment, the digitally controlled ramp generator may further comprise at least one one-shot unit for providing a control signal having a predetermined pulse width. According to a further embodiment, the digitally controlled ramp generator may further comprise a first comparator coupled with said output node and a first controllable threshold reference voltage. According to a further embodiment, the digitally controlled ramp generator may further comprise a second comparator coupled with said output node and a second controllable threshold reference voltage. According to a further embodiment, the controllable first and second threshold reference voltage may be generated by a first and second digital-to-analog converter, respectively. According to a further embodiment, the first threshold reference voltage may determine a minimum voltage of a waveform. According to a further embodiment, the first threshold reference voltage may determine a maximum voltage of a waveform. According to a further embodiment, the reference voltage may be provided by a digitally controllable reference voltage module. According to a further embodiment, the first switch may be controlled by the first voltage reference and the second switch is controlled by a second voltage reference. According to a further embodiment, the first switch can be controlled by the first voltage reference and the second switch is controlled by a predefined time signal. According to a further embodiment, the first switch can be controlled by a first predefined time signal and the second switch is controlled by a second predefined time signal.

According to a further embodiment, in a third operating mode, the control unit can be configured to select control signals for the third and first controllable switch to generate a rising waveform by charging said capacitor through the first controllable switch and a falling waveform by discharging the capacitor through the third controllable switch wherein the control signals can be selected to be one of time or voltage based control signals. According to a further embodiment, the digitally controlled ramp generator may further comprise a first and second multiplexer for selecting respective input control signals. According to a further embodiment, the control unit may comprise a state machine receiving said input control signals and providing said control signals to said first and second switches depending on an operating mode programmed into said control unit. According to a further embodiment, the digitally controlled ramp generator may further comprise at least one one-shot unit for providing a control signal having a predetermined pulse width. According to a further embodiment, the digitally controlled ramp generator may further comprise a first comparator coupled with said output node and a first controllable threshold reference voltage. According to a further embodiment, the digitally controlled ramp generator may further comprise a second comparator coupled with said output node and a second controllable threshold reference voltage. According to a further embodiment, the controllable first and second threshold reference voltage can be generated by a first and second digital-to-analog converter, respectively. According to a further embodiment, the first threshold reference voltage may determine a minimum voltage of a waveform. According to a further embodiment, the first threshold reference voltage may determine a maximum voltage of a waveform. According to a further embodiment, the reference voltage can be provided by a digitally controllable reference voltage module. According to a further embodiment, the first switch can be controlled by the first voltage reference and the second switch is controlled by a second voltage reference. According to a further embodiment, the first switch can be controlled by the first voltage reference and the second switch is controlled by a predefined time signal. According to a further embodiment, the first switch can be controlled by a first predefined time signal and the second switch is controlled by a second predefined time signal.

According to yet another embodiment, a digitally controlled ramp generator may comprise a capacitor coupled with an output node; a reference voltage coupled with said output node via the capacitor; a first controllable switch connected in parallel with said capacitor; a second controllable switch coupled with the output node; a constant current sink coupled with the second controllable switch; and a control unit configured in a first operating mode to select control signals for the first and second controllable switch to generate a rising waveform by charging said capacitor through the first controllable switch and a falling waveform by discharging the capacitor through the second controllable switch wherein the control signals can be selected to be one of time or voltage based control signals.

According to a further embodiment, the digitally controlled ramp generator may further comprise a constant current source; a third controllable switch coupled between the constant current source and the output node; wherein in second operating mode, the control unit is configured to select control signals for the third and second controllable switch to generate a rising waveform by charging said capacitor through the third controllable switch and a falling waveform by discharging the capacitor through the second controllable switch wherein the control signals can be selected from the group of a time based control signal and a voltage based control signal.

According to a further embodiment, in a third operating mode, the control unit may be configured select control signals for the first and third controllable switch to generate a rising waveform by charging said capacitor through the third controllable switch and a falling waveform by discharging the capacitor through the first controllable switch wherein the control signals can be selected to be one of time or voltage based control signals. According to a further embodiment, the digitally controlled ramp generator may further comprise a first comparator coupled with said output node and a first controllable threshold reference voltage. According to a further embodiment, the digitally controlled ramp generator may further comprise a second comparator coupled with said output node and a second controllable threshold reference voltage. According to a further embodiment, the controllable first and second threshold reference voltage can be generated by a first and second digital-to-analog converter, respectively. According to a further embodiment, the digitally controlled ramp generator may further comprise a first and second multiplexer for selecting respective input control signals. According to a further embodiment, the control unit may comprise a state machine receiving said input control signals and providing said control signals to said first, second and third switches depending on an operating mode programmed into said control unit. According to a further embodiment, the digitally controlled ramp generator may further comprise at least one one-shot unit for providing a control signal having a predetermined pulse width.

According to another embodiment, a microcontroller may comprise any of the above described digitally controlled ramp generators.

According to yet another embodiment, a method for generating a plurality of waveforms, may comprise: charging a capacitor to a first threshold; discharging the capacitor to a second threshold, wherein the first and second threshold can be selected from the group consisting of a time based threshold and a voltage based threshold.

According to a further embodiment of the method, a voltage based threshold can be determined by a comparator coupled with the capacitor. According to a further embodiment of the method, the threshold can be set by a digital-to-analog converter. According to a further embodiment of the method, the time based threshold can be determined by selecting a pulse width modulated signal. According to a further embodiment of the method, the capacitor can be charged linearly by a constant current source. According to a further embodiment of the method, the capacitor can be discharged linearly by a constant current sink. According to a further embodiment of the method, the capacitor can be charged through a resistor preferably an inherent resistor of a switch. According to a further embodiment of the method, the capacitor can be discharged through a resistor, preferably an inherent resistor of a switch.

DETAILED DESCRIPTION

According to various embodiments, a digital interface can be utilized to control the internal current source/sink in order to ramp an output voltage up and/or down.

Figure 1:
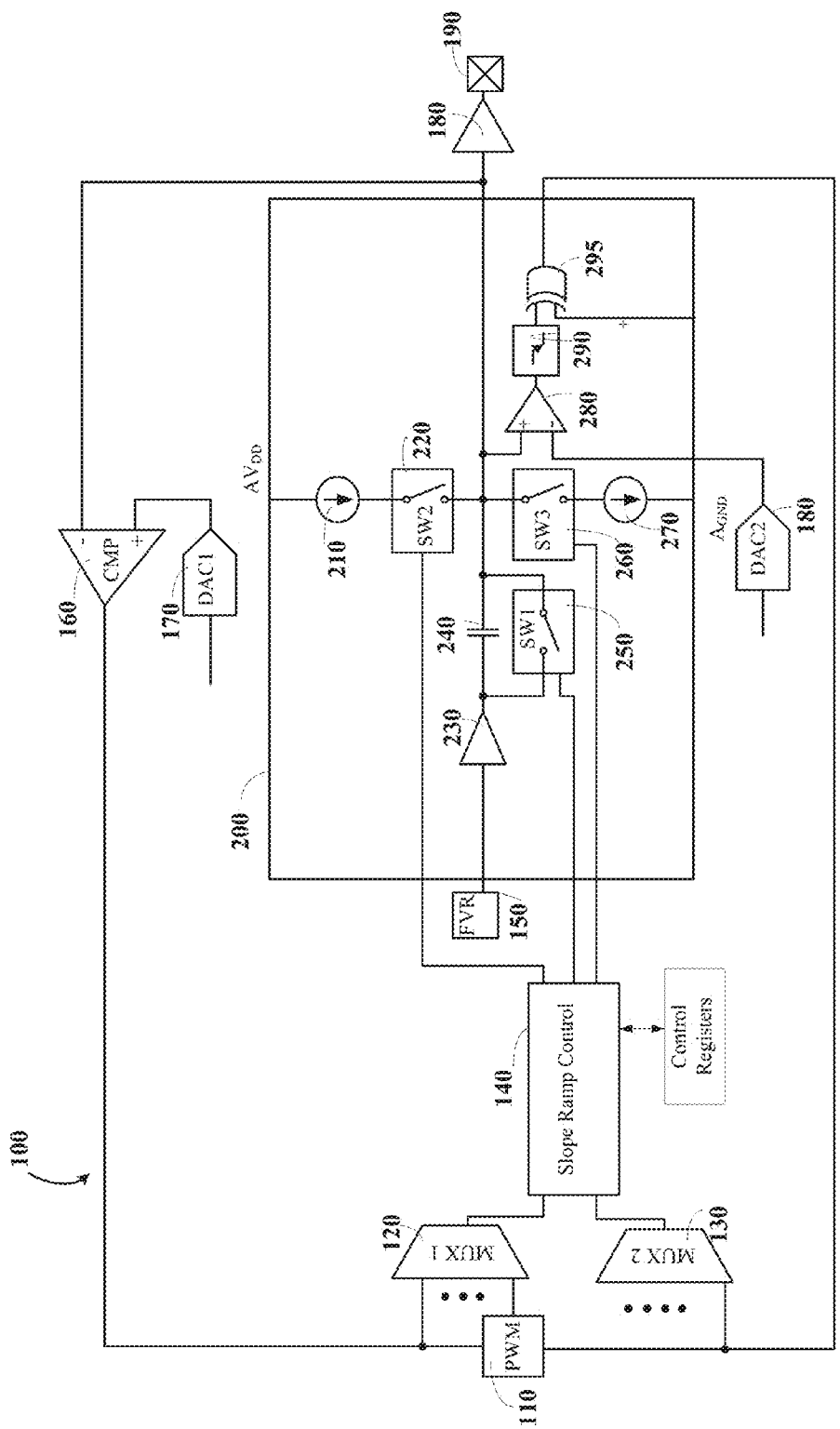
FIG. 1 shows a first embodiment of a ramp generating module.

FIG. 1 shows a schematic circuit diagram according to an embodiment of a ramp generating module 100. A pulse width modulator (PWM) 110 generates an output signal fed to a first multiplexer 120. The PWM 110 may also receive feedback signals from a slope-ramp generator module 200 and a comparator 160. The output signal of slope-ramp generator module 200 is also fed to a second multiplexer 130. The output signals of multiplexers 120 and 130 are fed to a slope ramp control unit 140, which according to some embodiments may be formed by a state machine. The control unit 140 may further include one-shot units to provide for respective control signals for the various switches as will be explained in more detail below. The control unit 140 may further be coupled with or comprise a plurality of special function registers 145 for setting control parameters. The control unit 140 controls the function of slope-ramp generator module 200, for example, may control several switches within the generator 200 as shown in FIG. 1. Generator module 200 receives a reference voltage from a reference module 150 which is fed through a buffer 230 to a first terminal of a capacitor 240 whose second terminal is connected through an output of module 200 with another buffer 180 and the inverting input of comparator 160. A first controllable switch 250 is connected in parallel with capacitor 240 to discharge the capacitor. A current source 210 is provided which can be coupled through a second switch 220 with the second terminal of capacitor 240. A third controllable switch 260 connects the second terminal of capacitor 240 with a current sink 270. Current source 210 and current sink 270 may be designed to be programmable, for example through a special function register. Generator module 200 further comprises a comparator 280 whose non-inverting input is connected with the second terminal of capacitor 240 and whose inverting input receives a reference voltage which, for example, can be set by a programmable digital-to-analog converter (DAC) 180. The output of comparator 280 is connected to an edge detector 290 whose output is coupled with the first input of XOR gate 295 through which the output signal of comparator 280 can be programmably inverted. Comparator 160 receives at its non-inverting input another reference voltage, which again can be generated by another DAC 170. The output of comparator 160 is also coupled with another input of multiplexer 120. Multiplexers 120 and 130 provide for the selection of various input signals as indicated by the plurality of dots.

Figure 2:
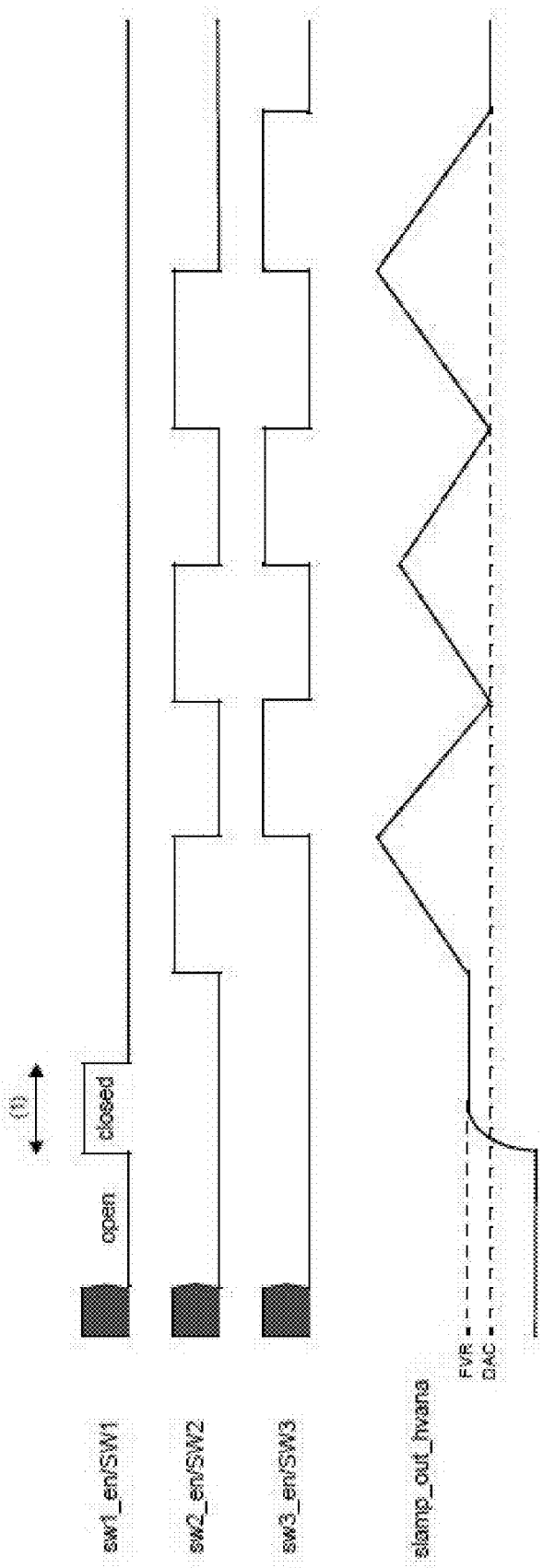
FIG. 2 shows a first ramp generating timing diagram.

A ramp generation function according to various embodiments can be established by employing the built-in current source/sink 210, 270 and relying on the synchronous control of the analog switches 220, 250, and 260 to ramp the module's output voltage up and then subsequently down. Once initialized, the output voltage is ramped up linearly by the current source 220 charging capacitor 240 at a programmable rate until either the target voltage as determined by comparator 280 or time-out is reached at which point the constant current source 210 is disengaged via switch 220. At the same time, the current sink 270 may be utilized via switch 260 to linearly ramp down the output voltage, also at a programmable rate until the target voltage is reached, which again can be determined by comparator 280 or until a time-out is reached. The process may then repeat to create a saw tooth like or triangle shaped wave form, as shown in FIG. 2, 3, 6, 7, or 10-13. It is to be noted that synchronization of switch 220 and switch 260 may be crucial in the operation of the module's ramp generation function according to some implementations. As shown in FIG. 2, the voltage generated by reference voltage module 150 and the voltage generated by DAC 180 are shown with the dotted lines.

To control the currents, a plurality of PWM signals may be provided which are fed to a first and second multiplexer 120 and 130 for selecting switching signals for switches 220 and 260 as shown in FIG. 1.

The entire circuit if implemented as shown in FIG. 1 can be operated in different operating modes to generate different types of waveforms and using different criterions to switch between rising and falling slope. However, a person skilled in the art will recognize that the circuit of such a module can be reduced and simplified to generate less or more waveforms, for example only one type of waveform. Thus, not all switches and programmability of the current source 210 and sink 270, provision of DAC 170, etc. may be necessary and some elements can be omitted or replaced by fixed elements.

Figure 3:
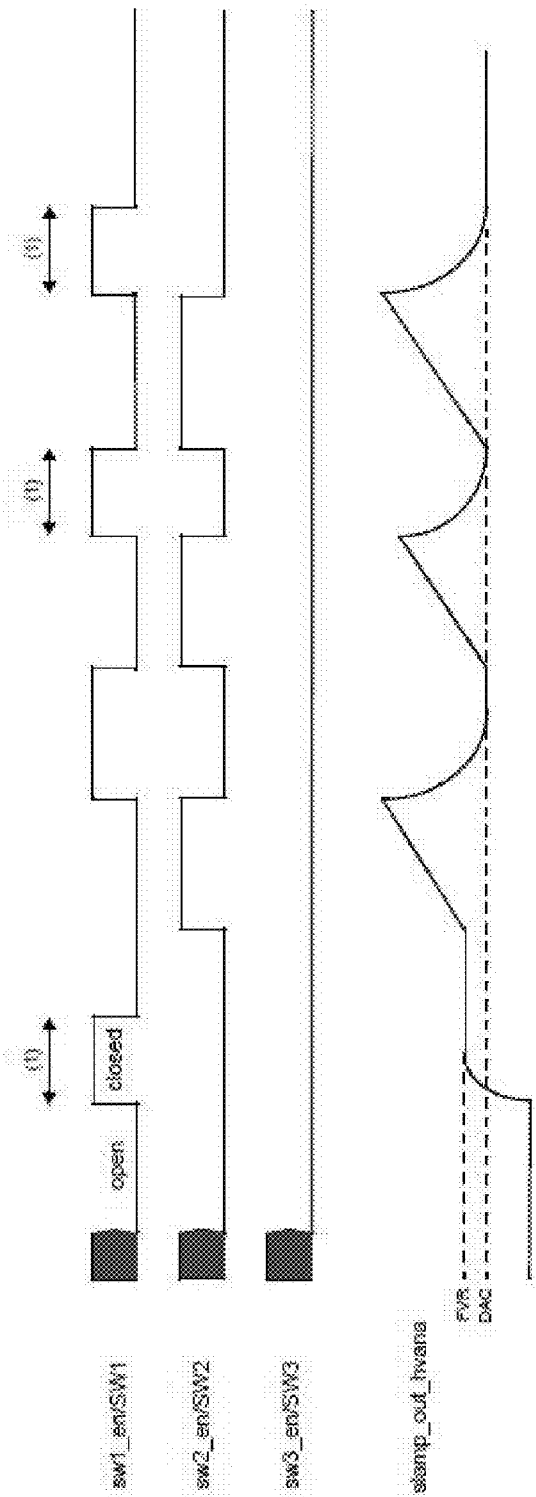
FIG. 3 shows a second ramp generating timing diagram.

For example, according to some embodiments or operating modes, switch 250 may be used instead of switch 260 in order to gradually discharge the module's output voltage through its native resistance. This produces a wave like output voltage as shown in FIG. 3. Since the control 140 of switch 250 (and switch 260) may be equipped with a one-shot pulse generator, its minimum closed time is guaranteed by the one-shot pulse duration. Again, synchronization of switch 250 and switch 260 may be crucial in the operation of this ramp generation function according to some embodiments.

The module 100 according to various embodiments, as for example shown in FIG. 1 or a variation of it, may be used amongst others, for example, for a slope Compensation for Peak-Current mode power supplies or a ramp generator for voltage mode power supplies. Such a module according to various embodiments allows the user to implement an analog PWM with, for example, infinite resolution. When combined with on-board or external comparators and operational amplifiers, this allows a user to implement high speed control systems on a relatively inexpensive 8-bit microcontroller which would otherwise only be possible with high-end digital signal processors DSP's. Furthermore, such a module supports center aligned PWM.

Conventional microcontrollers for high speed power supplies, such as a PIC16F1786 manufactured by applicant, require one external ramp generator, 1 capacitor, 1 resistor, 1 transistor, and 2 pins. This results in a noisy system due to the power supply's inductors with a high peak current. It is of course highly desirable to use a few external components as necessary. Thus, a generator module according to various embodiments can be provided that integrates all components necessary for waveform generation.

A system that includes all three switches 220, 250, and 260 may as indicated above have a variety of operating modes, wherein in each operating mode, two of the three switches 220, 250, and 260 may be selected and the switches can be controlled time based or level based, wherein PWM signals or permanent on signals are used to operate the respective switch. As mentioned above, a state machine or control unit 140 and associated control registers 145 can be implemented to select/control the correct control signal sequences. The various embodiments indicated in FIG. 1 and the following figures and associated timing diagrams shows that various operating modes are possible and can be selected under program control when the device is implemented as a peripheral device, for example in a microcontroller.

According to various embodiments, an integrated solution as for example shown in FIG. 1, can be provided with an analog current source/sink 210/270 that has a programmable source capacity for ramp rate control. A programmable sink capacity for fall rate control may also be used, and can be process calibrate-able. Furthermore, by converting trigger inputs to switch control signals by a digital controller, the analog output voltage can be ramped up and/or down. Rise/fall trigger inputs can be based on voltage level and/or time. Switch control outputs are provided by the control unit or state machine 140. The controller may have one or more built-in one-shot units for guaranteed minimum fall time and comprise a CPU interface with polarity control and edge vs level control as for example shown in FIG. 1 and FIG. 4.

Figure 4:
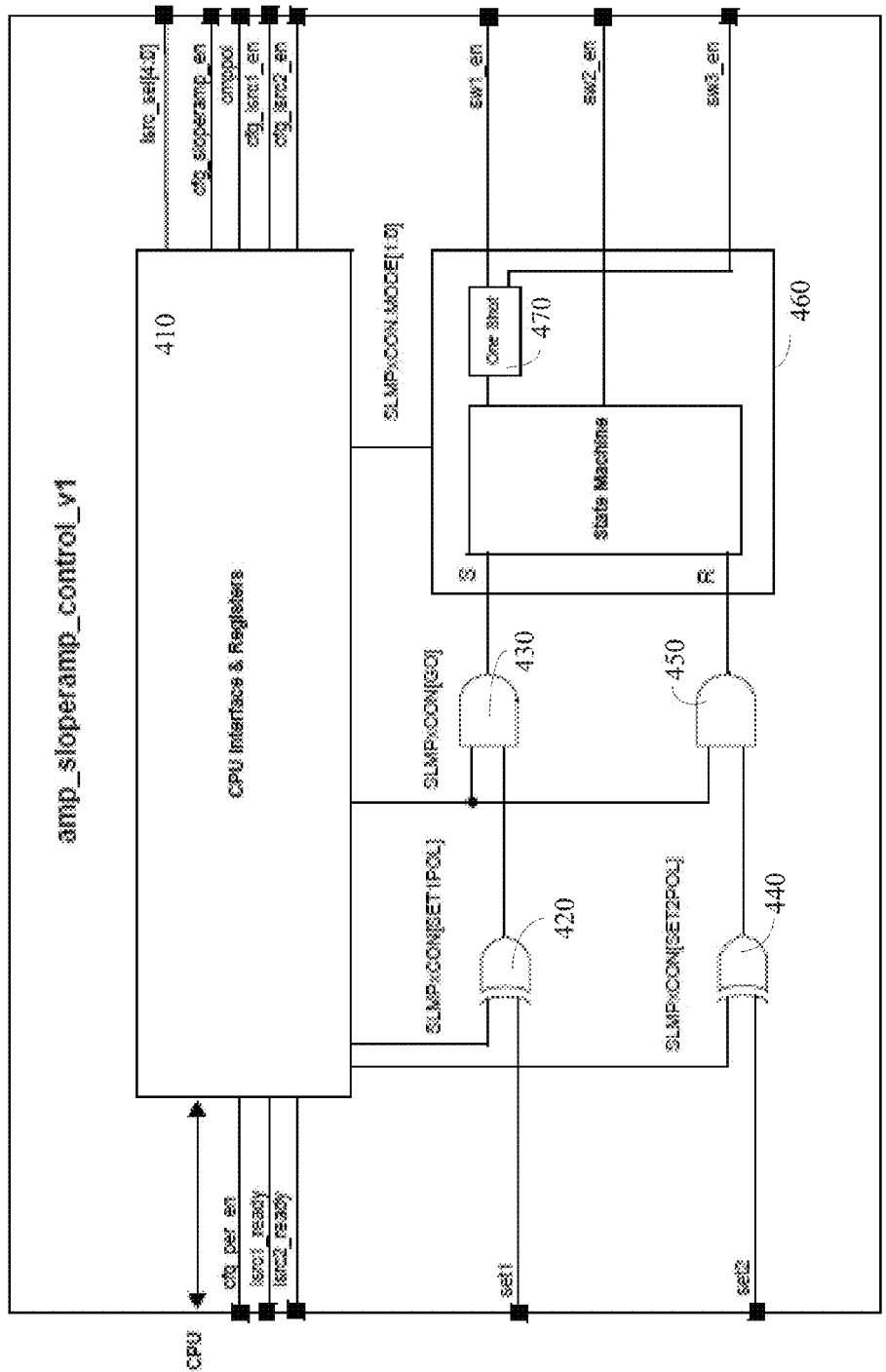
FIG. 4 shows a module block diagram.

FIG. 4 shows an embodiment of a control unit 140. A CPU interface and register unit 410 is provided, which for example comprises a plurality of memory mapped special function registers to allow for a flexible programmability. Logic gates 420-450 may provide for start and reset signals for a state machine integrated within a switch control unit 460 that is provided in unit 140. In this embodiment, the state machine 460 is used to generate the control signals for the switches 220, 250 and 260. This internal control unit 460 furthermore may comprise one shot units 470 to generate controllable one-shot pulses for the first and third switches 250 and 260.

Figure 5:
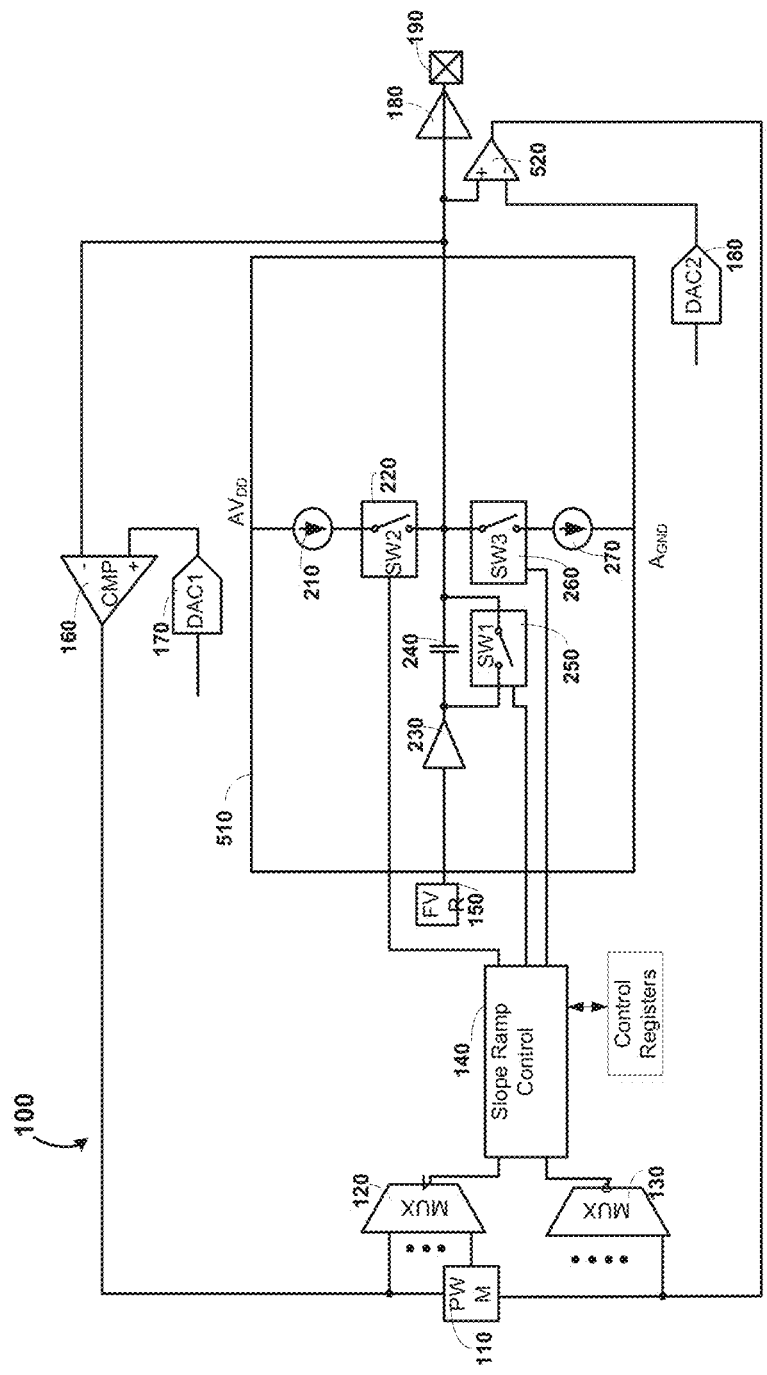
FIG. 5 shows a second embodiment of a ramp generating module.
Figure 6:
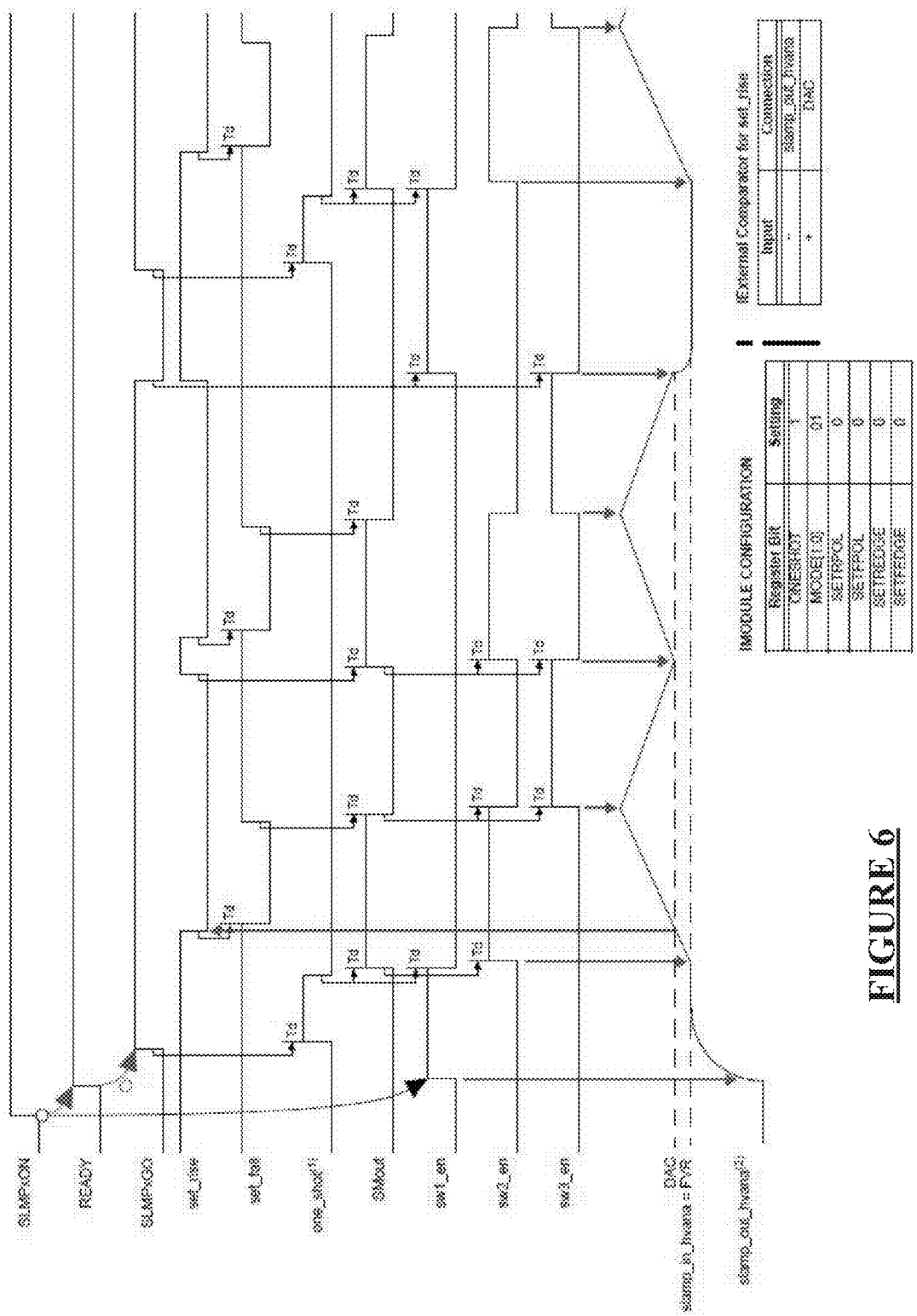
FIG. 6 shows a first timing diagram with switches 220 and 260 in operation.
Figure 7:
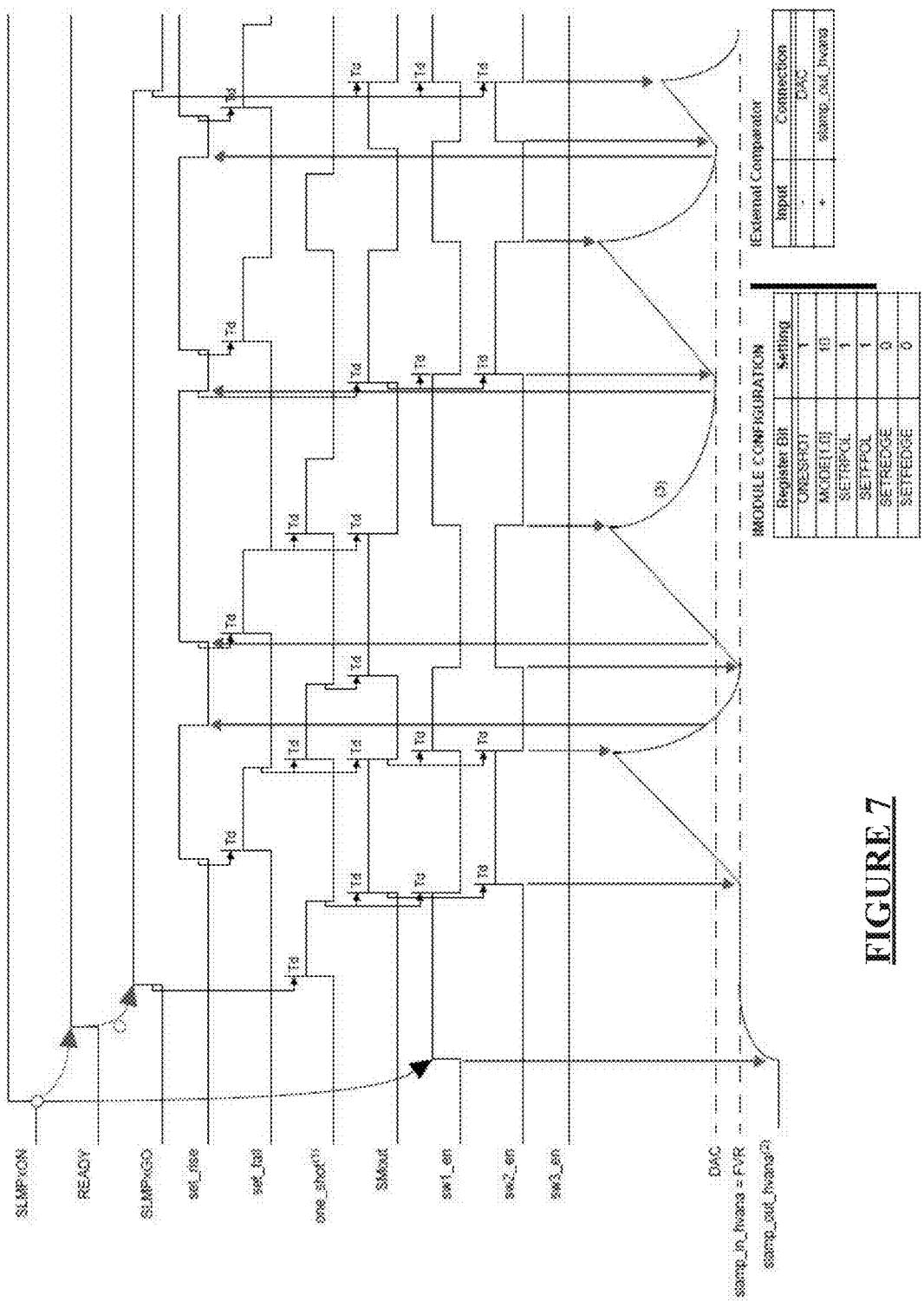
FIG. 7 shows a first timing diagram with switches 250 and 220 in operation.

FIG. 5 shows another embodiment that is similar to FIG. 1. Here the slope-ramp generator module 510 does not comprise a comparator and associated circuitry but is otherwise identical to the one shown in FIG. 1. Instead the comparator 520 is provided externally, for example by an already present analog comparator 520. The timing diagram of FIG. 6 shows a waveform similar to that shown in FIG. 2. To this end, the module 500 again uses the second switch 220 to set the rise which is level based and the third switch 260 which sets the fall which is time based. Accordingly, FIG. 7 shows a timing diagram of a second type of waveform similar to FIG. 3 in which the first and second switches 250 and 220 are used wherein the rise time is set again by level based switch 220 and the fall by time based switch 250.

Figure 8:
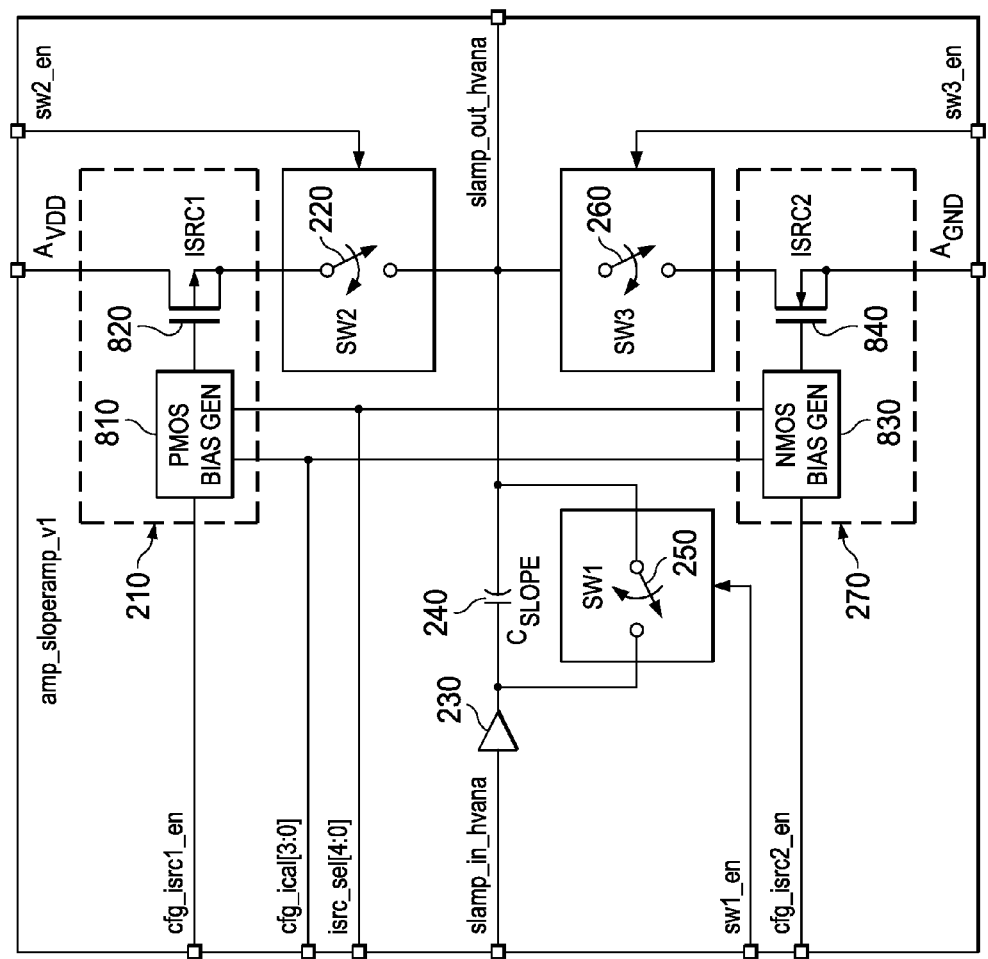
FIG. 8 shows a more general circuit diagram of the analog part of a ramp generator.

FIG. 8 shows a more detailed block diagram of the analog parts in the generator module 200 according to various embodiments. Here, programmable/configurable bias generators 810, 830 control respective MOSFETs 820, 840 to form current source 210 and current sink 270. FIG. 8 shows individual enable lines cfg_isrc1_en and cfg_isrc2_en for current source 210 and current sink 270, respectively. Furthermore, common calibration lines cfg_ical[3:0] and current select lines isrc_sel[4:0] are provided. Other means to digitally set the respective source and sink currents may be provided.

Figure 9:
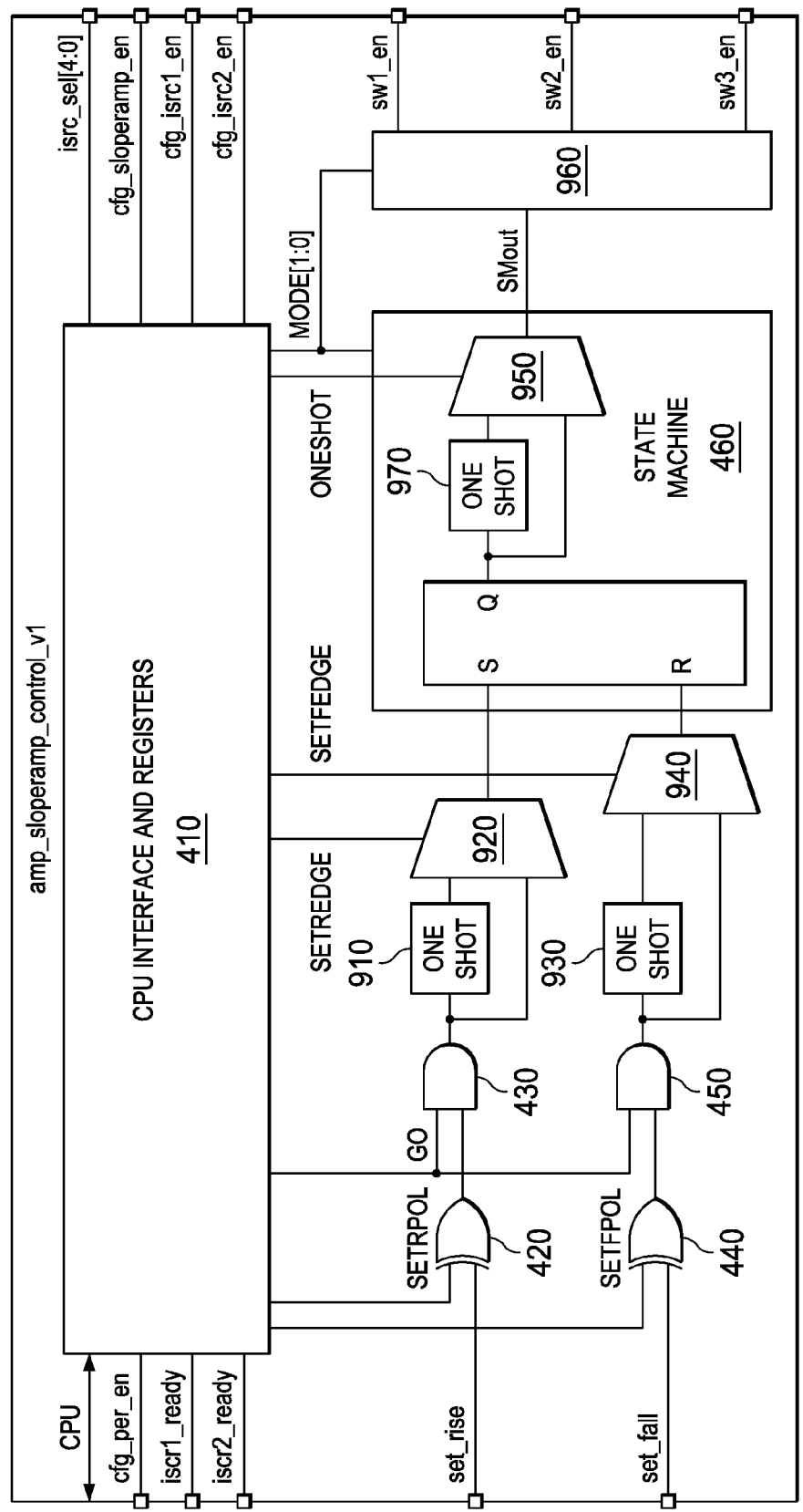
FIG. 9 shows the digital controller part.

FIG. 9 shows another embodiment of a slope-ramp control unit 200 Similar elements with respect to FIG. 4 carry similar reference symbols. In addition to the block diagram of FIG. 4, FIG. 9 shows two one-shot modules 910 and 930 coupled with the output of AND gates 430 and 450, respectively. Two multiplexers 920 and 940 are provided which allow to select the output signals of one-shot modules 910 and 930, respectively or to by-pass them. Similarly, a single one-shot unit 970 is provided within control unit 460 and an associated multiplexer 950 allows to select this or a by-passed signal. The single output signal from multiplexer 950 is then forwarded to a distribution unit 960 which selects the respective control line for one of the three switches 220, 250 or 260.

Figure 10:
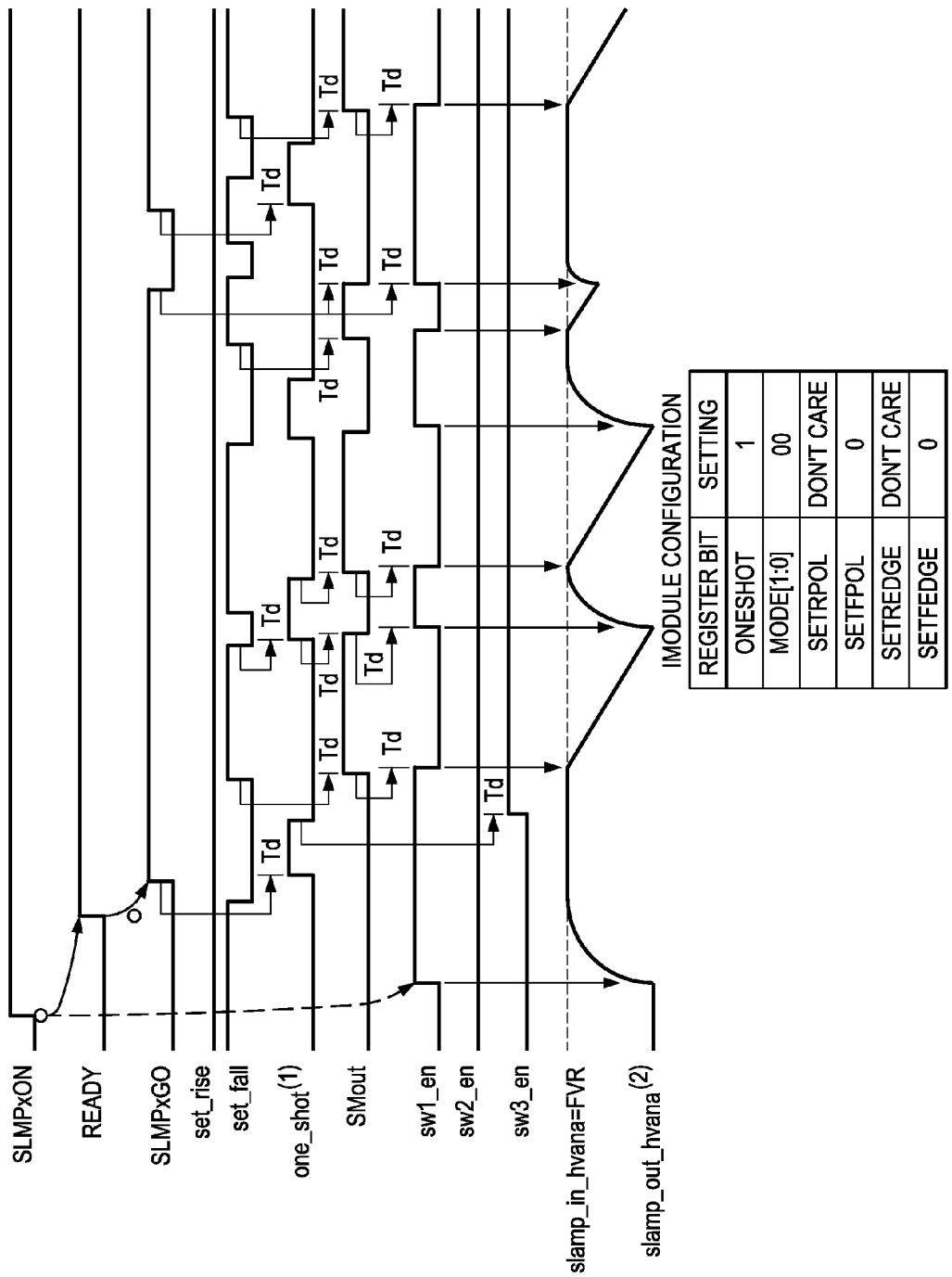
FIG. 10 shows a third timing diagram showing slope compensation.

FIG. 10 shows a timing diagram depicting a third type of waveform that can be generated by the peripheral as disclosed in various embodiments. Here a slope compensation is performed. This waveform is generated by using the first switch 220 for charging the shorted capacitor to the reference voltage and the third switch to linearly discharge the capacitor 240.

Figure 11:
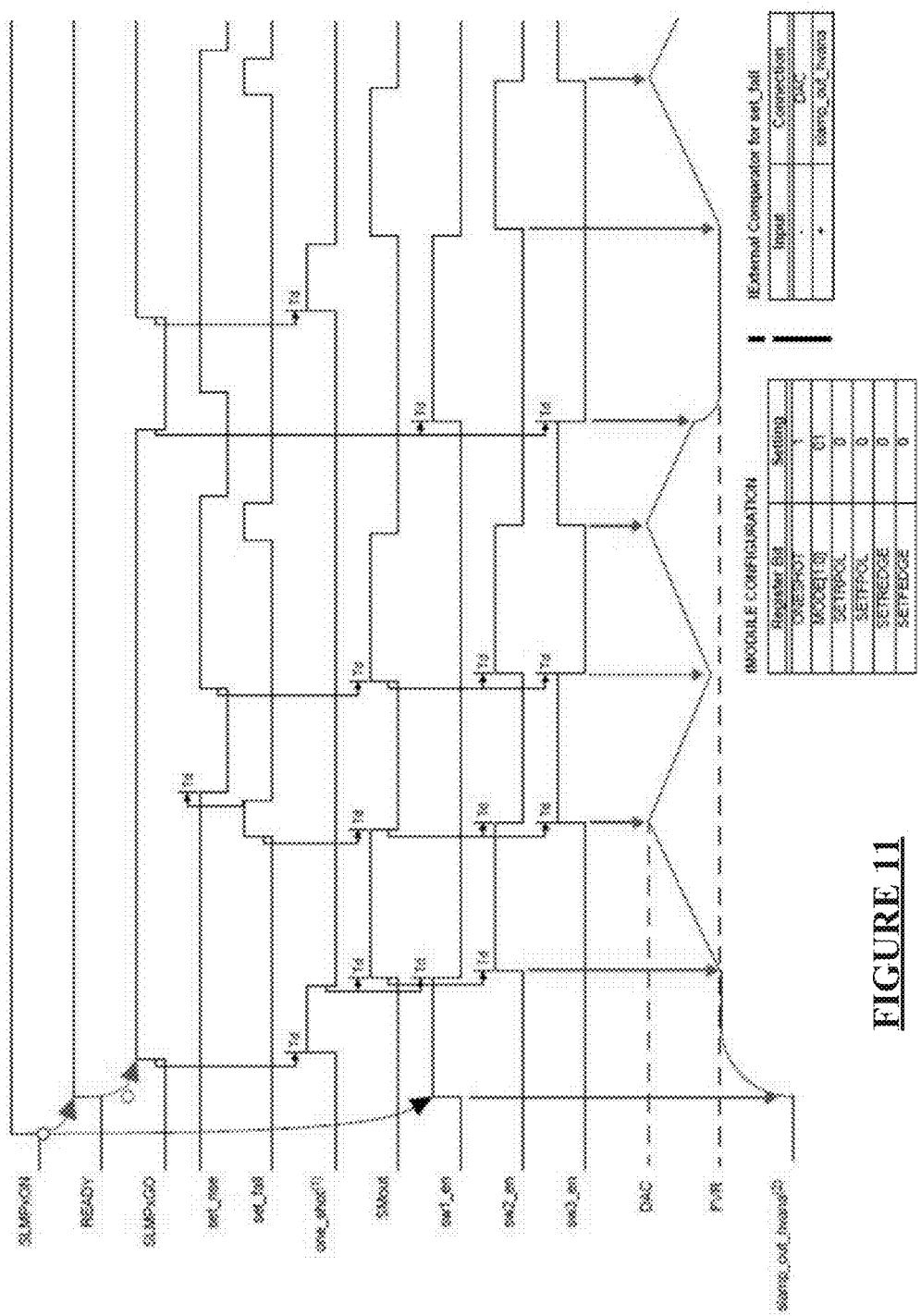
FIG. 11 shows another timing diagram with switches 220 and 260 in operation.

FIG. 11 shows a timing diagram of a waveform that uses the DAC 180 to set the upper limit of the rising ramp and control the second switch 220 whereas the lower limit is determined by the time of the switch control signal for the third switch 260. Thus, contrary to FIG. 6, the maximum output voltage is controlled by comparator 280 in FIG. 11 as opposed to the minimum voltage of the triangular pattern in FIG. 6.

Figure 12:
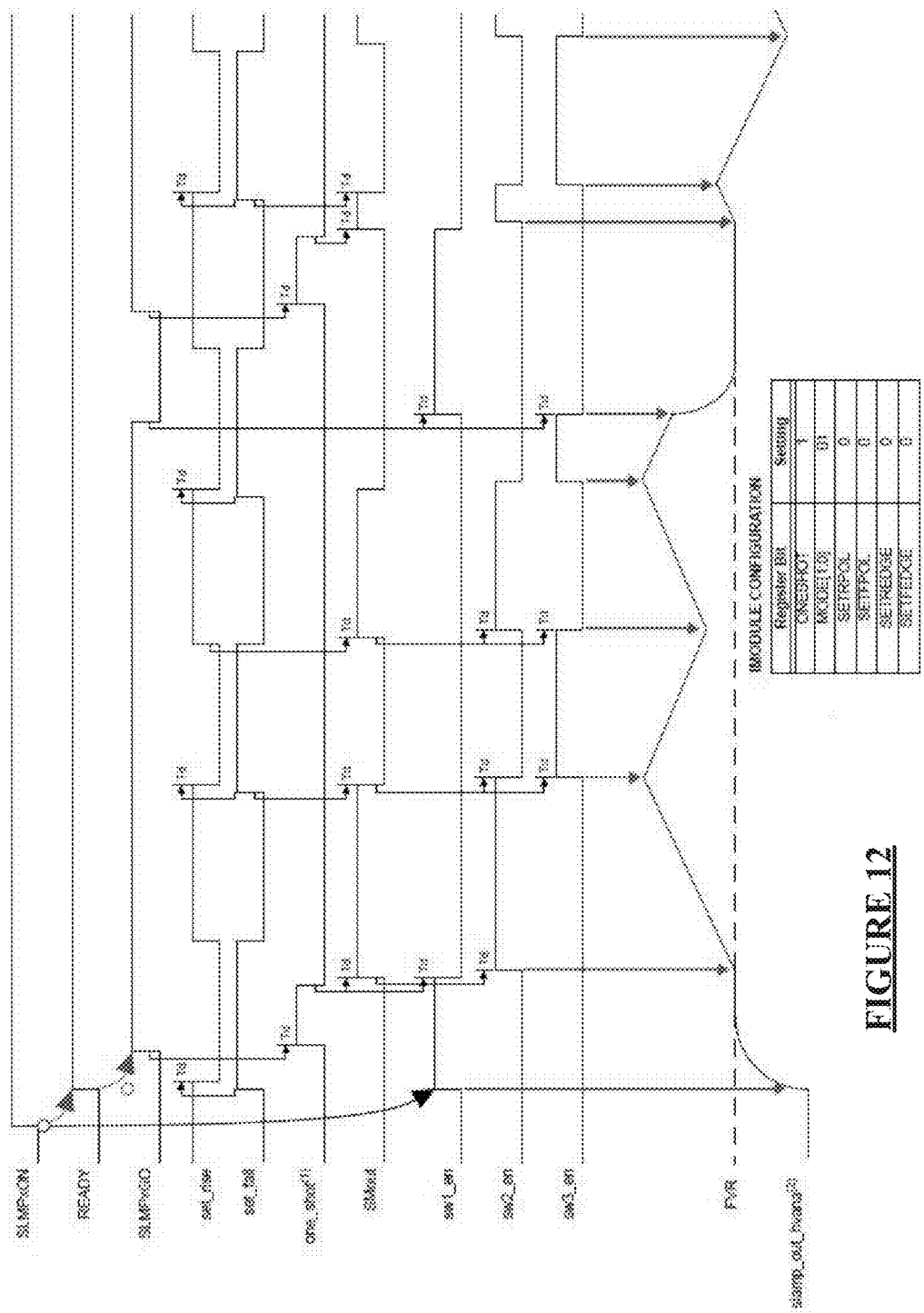
FIG. 12 shows another timing diagram with switches 220 and 250 in operation.

FIG. 12 shows a timing diagram with switches 220 and 260 both time based operated. Thus, comparator 280 is not used in this operating mode.

Figure 13:
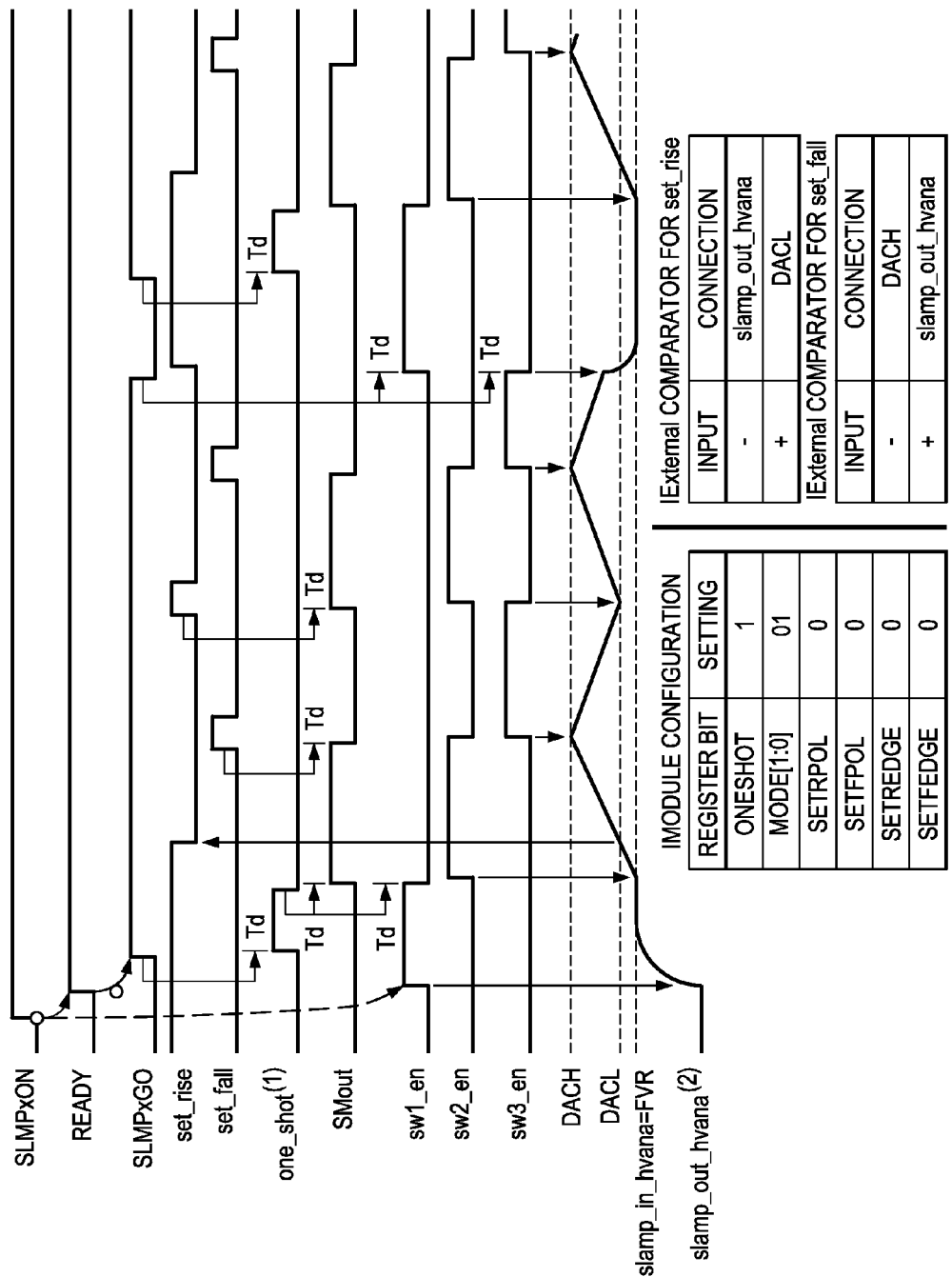
FIG. 13 shows yet another timing diagram with switches 220 and 250 in operation.

FIG. 13 shows a timing diagram with switches 220 and 260 are both level based operated. In this embodiment both comparators 280 and 160 are used to set the upper and lower thresholds as indicated in FIG. 13 with levels DACH and DACL.

Depending on what types of signals need to be generated and the manner they are controlled, no comparator, one or two comparators may be necessary. FIG. 1 shows an example in which the generator module 200 comprises one comparator 280. Thus, a microcontroller may have a comparator module with a single comparator 160 internally available that can be internally switched to connect to the output of the generator module 200. Thus, such an embodiment allows for operation in which no comparator, one or two comparators are used to operate the waveform module in various generating modes that allow for time based or voltage based signal generation.

Furthermore, the built-in comparator 280 can be provided according to various embodiments to assist in the control of the analog switches 220, 250, 260 when a voltage level is used as a reference for the change in direction of the voltage ramping. According to some embodiments and the desired functionality, the core of this function may require:

that source 210 and/or sink 270 is/are programmable current sources/sinks
switch 220
an on-chip capacitor 240 in series with the voltage source (optional)
switch 250 across the capacitor (optional)
a programmable current sink 270 (optional), and/or
switch 270 (optional)

In summary, a rise-fall waveform generation according to various embodiments, provides for a user programmable rise/fall rate, for example, under program control using the above stated elements, three different waveform types for a variety of uses, level or edge based triggers, and independent rise/fall input trigger sources.

What is claimed is:
1. A digitally controlled ramp generator, comprising:
a constant current source;
a first controllable switch coupled between the constant current source and an output node;
a capacitor coupled with the output node;
a second controllable switch coupled with the output node;

a constant current sink coupled with the second controllable switch; and a control circuit configured in a first operating mode to select control signals for the first and second controllable switch to generate a rising waveform by charging said capacitor through the first controllable switch and a falling waveform by discharging the capacitor through the second controllable switch;

wherein the control circuit is configured to select the control signals can be selected from a group, the group including a time based control signal and a voltage based control signal and is configured to apply the time based control signal and the voltage based control signal to one or more of the controllable switches; and wherein the control circuit comprises a state machine receiving input control signals and providing said control signals to said first and second controllable switches depending on an operating mode programmed into said control circuit;

wherein the digitally controlled ramp generator further comprises a first and second multiplexer for selecting respective input control signals.

2. The digitally controlled ramp generator according to claim 1, further comprising a first comparator coupled with said output node and a first controllable threshold reference voltage.

3. The digitally controlled ramp generator according to claim 2, further comprising a second comparator coupled with said output node and a second controllable threshold reference voltage.

4. The digitally controlled ramp generator according to claim 3, wherein the controllable first and second threshold reference voltage is generated by a first and second digital-to-analog converter, respectively.

5. The digitally controlled ramp generator according to claim 2, wherein the first threshold reference voltage determines a minimum voltage of a waveform.

6. The digitally controlled ramp generator according to claim 2, wherein the first threshold reference voltage determines a maximum voltage of a waveform.

7. The digitally controlled ramp generator according to claim 1, wherein the constant current source is a digitally controllable constant current source or the constant current sink is a digitally controllable constant current sink.

8. A microcontroller comprising a digitally controlled ramp generator according to claim 1.

9. The digitally controlled ramp generator according to claim 1, wherein the control circuit comprises a state machine receiving said input control signals and providing said control signals to said first and second controllable switches depending on an operating mode programmed into said control circuit.

10. The digitally controlled ramp generator according to claim 1, further comprising at least one one-shot for providing a one-shot control signal having a predetermined pulse width.

11. A digitally controlled ramp generator, comprising:
a constant current source;
a first controllable switch coupled between the constant current source and an output node;
a capacitor coupled with the output node;
a second controllable switch coupled with the output node;
a constant current sink coupled with the second controllable switch;
a control circuit configured in a first operating mode to select control signals for the first and second controllable switch to generate a rising waveform by charging said capacitor through the first controllable switch and a falling waveform by discharging the capacitor through the second controllable switch;

a reference voltage coupled with said output node via the capacitor; and a third controllable switch connected in parallel with said capacitor;

wherein:
the control circuit is configured to select the control signals can be selected from a group, the group including a time based control signal and a voltage based control signal and is configured to apply the time based control signal and the voltage based control signal to one or more of the controllable switches;

the control circuit comprises a state machine receiving input control signals and providing said control signals to said first and second controllable switches depending on an operating mode programmed into said control circuit; and in a second operating mode, the control circuit is configured to select control signals for the third and second controllable switch to generate a rising waveform by charging said capacitor through the third controllable switch and a falling waveform by discharging the capacitor through the second controllable switch wherein the control signals are selected from one of time or voltage based control signals.

12. The digitally controlled ramp generator according to claim 11, further comprising a first comparator coupled with said output node and a first controllable threshold reference voltage.

13. The digitally controlled ramp generator according to claim 12, further comprising a second comparator coupled with said output node and a second controllable threshold reference voltage.

14. The digitally controlled ramp generator according to claim 13, wherein the controllable first and second threshold reference voltage is generated by a first and second digital-to-analog converter, respectively.

15. The digitally controlled ramp generator according to claim 12, wherein the first threshold reference voltage determines a minimum voltage of a waveform.

16. The digitally controlled ramp generator according to claim 12, wherein the first threshold reference voltage determines a maximum voltage of a waveform.

17. The digitally controlled ramp generator according to claim 11, wherein the reference voltage is provided by a digitally controllable reference voltage module.

18. The digitally controlled ramp generator according to claim 11, where the first controllable switch is controlled by a first voltage reference and the second controllable switch is controlled by a second voltage reference.

19. The digitally controlled ramp generator according to claim 11, where the first controllable switch is controlled by a first voltage reference and the second controllable switch is controlled by a predefined time signal.

20. The digitally controlled ramp generator according to claim 11, where the first controllable switch is controlled by a first predefined time signal and the second controllable switch is controlled by a second predefined time signal.

21. A microcontroller comprising a digitally controlled ramp generator according to claim 11.

22. The digitally controlled ramp generator according to claim 11, wherein in a third operating mode, the control circuit is configured to select control signals for the third and first controllable switch to generate a rising waveform by charging said capacitor through the first controllable switch and a falling waveform by discharging the capacitor through the third controllable switch wherein the control signals are selected from one of time or voltage based control signals.

23. The digitally controlled ramp generator according to claim 22, further comprising a first and second multiplexer for selecting respective input control signals.

24. The digitally controlled ramp generator according to claim 23, wherein the control circuit comprises a state machine receiving said input control signals and providing said control signals to said first and second controllable switches depending on an operating mode programmed into said control circuit.

25. The digitally controlled ramp generator according to claim 23, further comprising at least one one-shot unit for providing a one-shot control signal having a predetermined pulse width.

26. The digitally controlled ramp generator according to claim 22, further comprising a first comparator coupled with said output node and a first controllable threshold reference voltage.

27. The digitally controlled ramp generator according to claim 26, further comprising a second comparator coupled with said output node and a second controllable threshold reference voltage.

28. The digitally controlled ramp generator according to claim 27, wherein the controllable first and second threshold reference voltage is generated by a first and second digital-to-analog converter, respectively.

29. The digitally controlled ramp generator according to claim 26, wherein the first threshold reference voltage determines a minimum voltage of a waveform.

30. The digitally controlled ramp generator according to claim 26, wherein the first threshold reference voltage determines a maximum voltage of a waveform.

31. The digitally controlled ramp generator according to claim 22, wherein the reference voltage is provided by a digitally controllable reference voltage module.

32. The digitally controlled ramp generator according to claim 22, where the first controllable switch is controlled by a first voltage reference and the second controllable switch is controlled by a second voltage reference.

33. The digitally controlled ramp generator according to claim 22, where the first controllable switch is controlled by a first voltage reference and the second controllable switch is controlled by a predefined time signal.

34. The digitally controlled ramp generator according to claim 22, where the first controllable switch is controlled by a first predefined time signal and the second controllable switch is controlled by a second predefined time signal.

35. A microcontroller comprising a digitally controlled ramp generator according to claim 22.

36. A digitally controlled ramp generator, comprising:
a capacitor coupled with an output node;
a reference voltage coupled with said output node via the capacitor;
a first controllable switch connected in parallel with said capacitor;
a second controllable switch coupled with the output node;
a constant current sink coupled with the second controllable switch; and
a control circuit configured in a first operating mode to select control signals for the first and second controllable switch to generate a rising waveform by charging said capacitor through the first controllable switch and a falling waveform by discharging the capacitor through the second controllable switch;
wherein the control circuit selects the control signals can be selected from a group, the group including a time based control signal and a voltage based control signal and is configured to apply the time based control signal and the voltage based control signal to one or more of the controllable switches; and
wherein the control circuit comprises a state machine receiving input control signals and providing said control signals to said first and second controllable switches depending on an operating mode programmed into said control circuit.

37. The digitally controlled ramp generator according to claim 36, further comprising:
a constant current source;
a third controllable switch coupled between the constant current source and the output node;
wherein in second operating mode, the control circuit is configured to select control signals for the third and second controllable switch to generate a rising waveform by charging said capacitor through the third controllable switch and a falling waveform by discharging the capacitor through the second controllable switch wherein the control signals can be selected from a group, the group including a time based control signal and a voltage based control signal.

38. The digitally controlled ramp generator according to claim 37, wherein in a third operating mode, the control circuit is configured to select control signals for the first and third controllable switch to generate a rising waveform by charging said capacitor through the third controllable switch and a falling waveform by discharging the capacitor through the first controllable switch wherein the control signals can be selected to be one of time or voltage based control signals.

39. The digitally controlled ramp generator according to claim 37, further comprising a first comparator coupled with said output node and a first controllable threshold reference voltage.

40. The digitally controlled ramp generator according to claim 39, further comprising a second comparator coupled with said output node and a second controllable threshold reference voltage.

41. The digitally controlled ramp generator according to claim 40, wherein the controllable first and second threshold reference voltage is generated by a first and second digital-to-analog converter, respectively.

42. The digitally controlled ramp generator according to claim 37, further comprising a first and second multiplexer for selecting respective input control signals.

43. The digitally controlled ramp generator according to claim 42, wherein the control circuit comprises a state machine receiving said input control signals and providing said control signals to said first, second and third controllable switches depending on an operating mode programmed into said control circuit.

44. The digitally controlled ramp generator according to claim 43, further comprising at least one one-shot unit for providing a one-shot control signal having a predetermined pulse width.

45. A digitally controlled ramp generator, comprising:
a capacitor coupled with an output node;
a reference voltage coupled with said output node via the capacitor;
a first controllable switch connected in parallel with said capacitor;

a second controllable switch coupled with the output node;

a constant current sink coupled with the second controllable switch; and a control circuit configured in a first operating mode to select control signals for the first and second controllable switch to generate a rising waveform by charging said capacitor through the first controllable switch and a falling waveform by discharging the capacitor through the second controllable switch;

wherein the control circuit selects the control signals can be selected from a group, the group including a time based control signal and a voltage based control signal and is configured to apply the time based control signal and the voltage based control signal to one or more of the controllables switches; and wherein the generator further comprises at least one one-shot for providing a one-shot control signal having a predetermined pulse width.

* * * * *